US006118307A

United States Patent [19]

Shi et al.

[11] Patent Number: 6,118,307

[45] Date of Patent: Sep. 12, 2000

[54] SWITCHED CAPACITOR SORTER BASED ON MAGNITUDE

[75] Inventors: Bingxue Shi; Gu Lin, both of Beijing, China

[73] Assignee: Winbond Electronics Corp., Hsinchu, Taiwan

[21] Appl. No.: 09/257,719

[22] Filed: Mar. 2, 1999

[51] Int. Cl.[7] .......... G01R 19/00

[52] U.S. Cl. .......... 327/58; 327/69; 327/71

[58] Field of Search .......... 327/58, 61, 62, 327/69, 70, 71, 82, 91, 93, 94, 337, 407, 408

[56] References Cited

U.S. PATENT DOCUMENTS

| | | | |
|---|---|---|---|
| 5,049,758 | 9/1991 | Mead et al. | 365/185.21 |
| 5,059,814 | 10/1991 | Mead et al. | 706/33 |
| 5,703,503 | 12/1997 | Miyamoto | 327/58 |

*Primary Examiner*—Toan Tran
*Assistant Examiner*—Paul Dinh
*Attorney, Agent, or Firm*—Trask Britt

[57] ABSTRACT

A switched capacitor sorter based on magnitude includes a plurality of input units, a winner-take-all (WTA) circuit for finding a maximum voltage level, and an output unit. A plurality of input voltages are simultaneously input to the respective input units, and the sorted results are output in a time-shared manner.

14 Claims, 4 Drawing Sheets

SWITCHED CAPACITOR SORTER BASED ON MAGNITUDE

BACKGROUND OF THE INVENTION

1. Field of the Invention

The present invention relates to a sorter for sorting a plurality of voltages, more particularly, to a switched capacitor sorter on magnitude for sorting a plurality of voltages by a simple circuit structure.

2. Description of Related Art

Sorting is an operation for arranging non-sequential data into sequential data. The such sorting operations have been widely used in processing systems in many fields. Currently, there are several types of sorting process available, such as bubble sorting, fast sorting, etc. However, those processes are difficult to perform in the form of integrated circuit. The sorting operation is implemented essentially by utilizing software via computers. Therefore, the operation speed, real-time processing and application field for the sorting operation are seriously limited.

The implementation of the sorting operation by hardware has been gradually developed. However, current sorting circuits are almost always digital sorting circuits. The structure of a digital sorting circuit is very complicated and the required sorting time is very long. Although the digital sorting circuit can also be used for analog signals, A/D and D/A converters are required, so that the structure of the circuit will be even more complicated. In addition, errors may occur in the conversion between digital signals and analog signals.

Accordingly, an analog voltage sorting circuit with a simple structure is desired, thus, the present invention is designed for this purpose.

SUMMARY OF THE INVENTION

One object of the present invention is to provide a switched capacitor sorter based on magnitude, and which is an analog voltage sorter with a simple structure.

Another object of the present invention is to provide a switched capacitor sorter based on magnitude, the sorting speed thereof is very fast.

In accordance with one aspect of the present invention, the switched capacitor sorter based on magnitude comprises a plurality of input units, a winner-take-all (WTA) circuit for finding a maximum voltage level, and an output unit. A plurality of input voltages are simultaneously input to the respective input units, and the sorted results are output in a time-shared manner.

Other objects, advantages and novel features of the invention will become more apparent from the following detailed description when taken in conjunction with the accompanying drawings.

DETAILED DESCRIPTION OF PREFERRED EMBODIMENT

Figure 1:
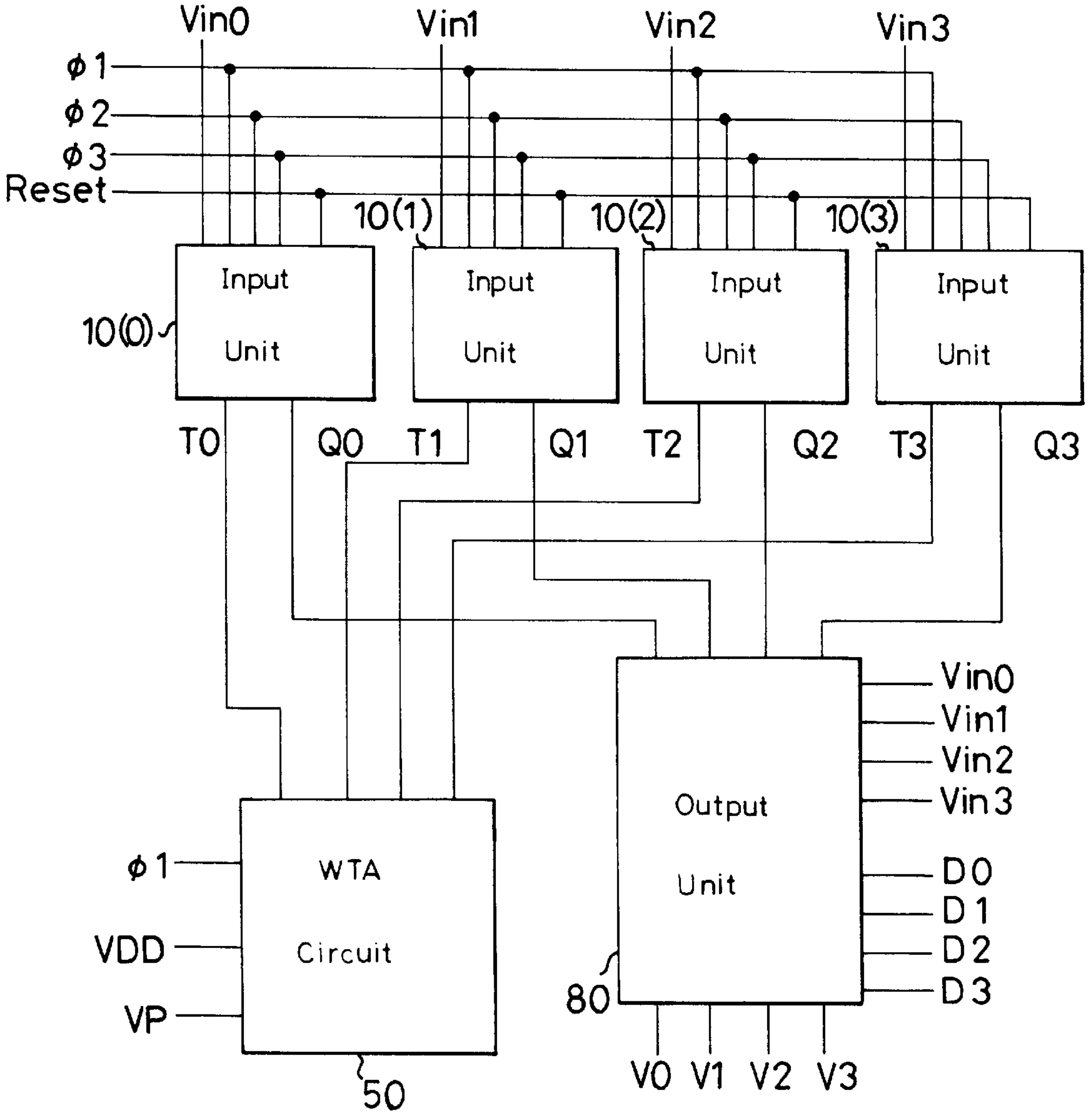
FIG. 1 is a block diagram showing a structure of a switched capacitor sorter based on magnitude in accordance with the present invention.

Referring to FIG. 1, an embodiment of a switched capacitor sorter based on magnitude in accordance with the present comprises four input units 10, a winner-take-all (WTA) circuit 50 and an output unit 80. For the sake of convenience, each of the four input units 10 is also referred to as an input unit **10(*k*) (k=0, 1, 2, 3). Four voltage signals of different levels Vin0, Vin1, Vin2, and Vin3 are input to the four input units 10(0), 10(1), 10(2), 10(3)**, respectively. In addition, three clock signals *__1__, *__2__, and *__3__ and a reset signal Reset are supplied to all of the four input units 10. Then the respective input units **10(*k*) (k=0, 1, 2, 3) transmit representing signals T0, T1, T2, and T3 to the WTA circuit 50**. The clock signal *__1__, a source voltage VDD and a bias voltage VP are also provided to the WTA circuit 50. The WTA circuit 50 compares the four signals T0, T1, T2, and T3, and drives the maximum one to be pulled up to the level of VDD while the other three signals are to be pulled down to the level of zero. According to the result of the WTA circuit 50, the input unit **10(*k*) which receives the maximum input voltage signal activates a control signal Qk (k=0, 1, 2, 3), thereby the output unit 80 outputs the maximum voltage signal at the first time. Then the operations above are repeated, so that the output unit 80 outputs a second maximum voltage signal at the second time. In this manner, all of the voltage signals, which are simultaneously input to the input units 10(*k*) (k=0, 1, 2, 3**), are output one by one in an order of magnitude. The details will be further described as follows.

Figure 2:
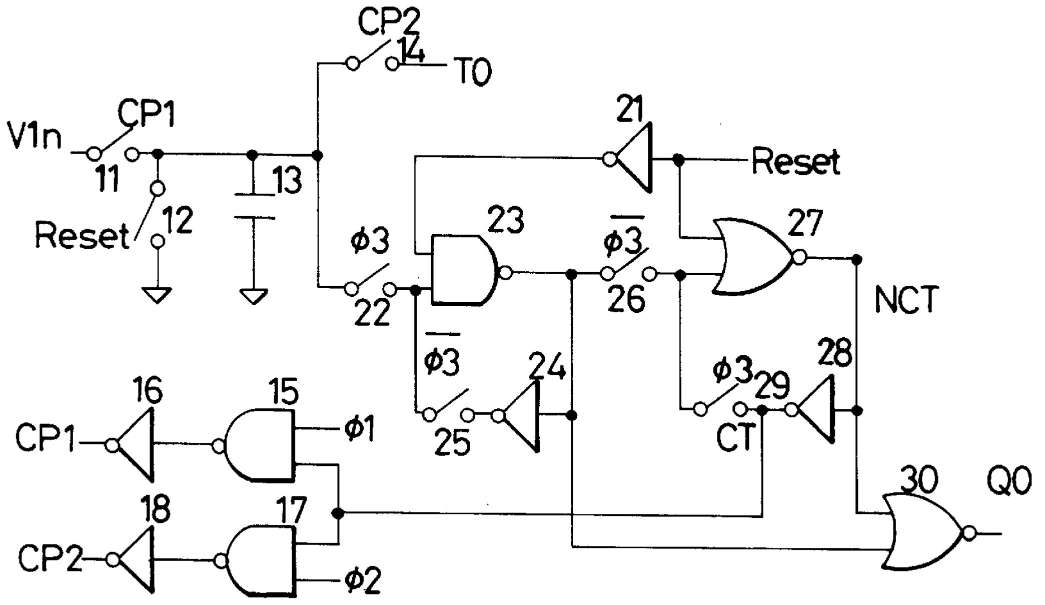
FIG. 2 is a circuit diagram of an input unit of the switched capacitor sorter based on magnitude in accordance with the present invention.

Referring to FIG. 2, each of the input units 10 comprises substantially a switched capacitor, a D type flip flop and some logic gates. In the present embodiment, the input unit 10 comprises a switch 11 for controlling the input of the input voltage signal Vin, a switch 12 for controlling the input of the reset signal Reset, a capacitor 13 connected between the two switches 11, 12 and a ground, and a switch 14 for controlling the access of the signal T. The input unit 10 further comprises an inverter 21 connected to the reset signal Reset, a switch controlled by the clock signal *__3__, a latch composed of a NAND gate 23, an inverter 24 and a switch 25 controlled by inverse *__3__, a switch 26 controlled by the inverse *__3__, another latch composed of a NOR gate 27, an inverter 28 and a switch 29 controlled by *__3__, and a NOR gate 30 for outputting the control signal Q. The input unit 10 further comprises a NAND gate 15 receiving the clock signal *__1__ and a signal from a node CT and an inverter 16 connected in series to generate a control signal CP1 to control the switch 11, and a NAND gate 17 receiving the clock signal *__2__ and a signal from the node CT and an inverter 18 connected in series to generate a control signal CP2 to control the switch 14.

Figure 3:
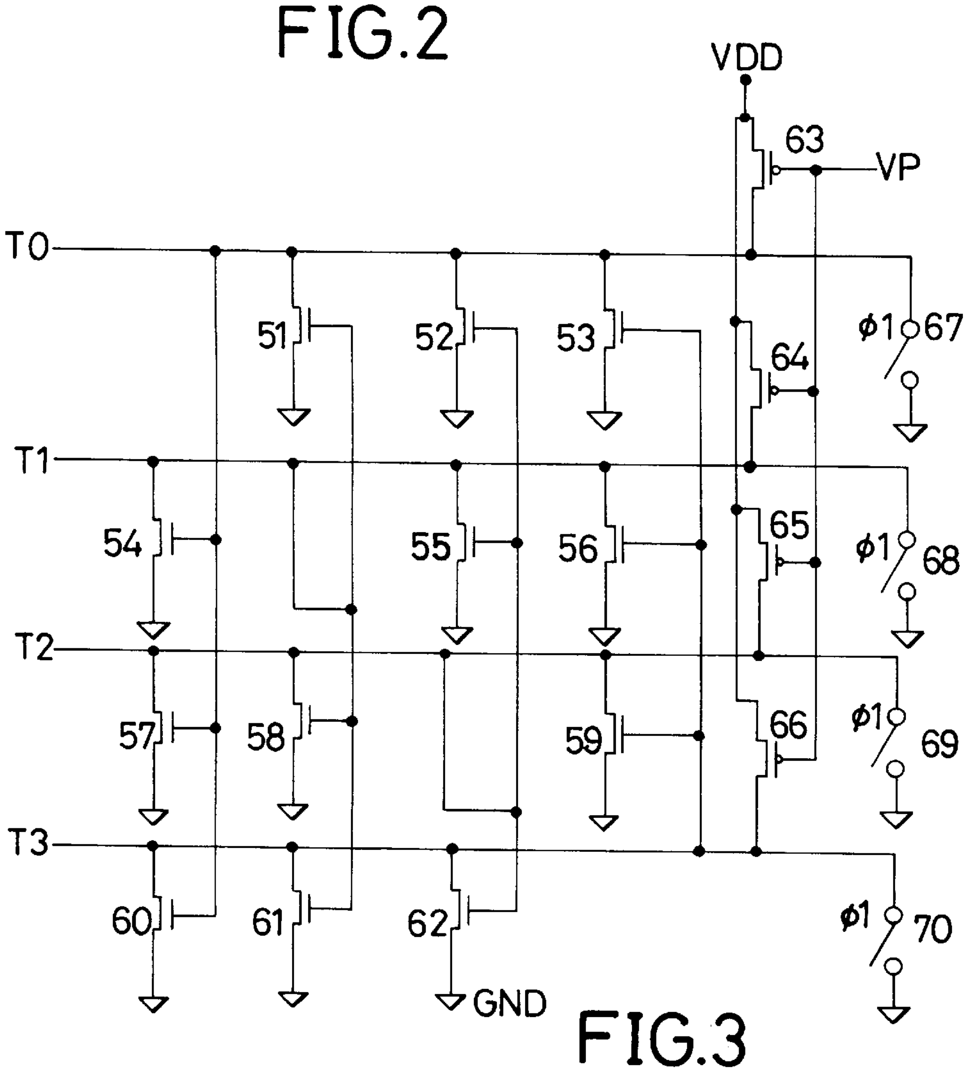
FIG. 3 is a circuit diagram of a WTA circuit of the switched capacitor sorter based on magnitude in accordance with the present invention.

Referring to FIG. 3, the WTA circuit 50, which is a high resolution symmetric WTA network, comprises 12 pull-down NMOS transistors 51–62, four pull-up PMOS transistors 63–66, and four switches 67–70 controlled by the clock signal *__1__. In this drawing, Tk (n=0, 1, 2, 3) each indicates a node, from which the signal T of each input unit 10 is input to the WTA circuit 50. The components of the WTA circuit 50 are grouped into four sections, each section is corresponding to a respective one of the nodes Tk (n=0, 1, 2, 3). A first section comprises pull-down NMOS transistors 51–53, a pull-up PMOS transistor 63 and a 29 switch 67. The drains of the pull-down NMOS transistors 51–53 are connected to the signal T0 of the input unit 10(0), the sources thereof are connected to ground, while the gates thereof are connected to the signals T1, T2, T3 from the input units 10(1), 10(2) and 10(3), respectively. The pull-up PMOS transistor 63 is connected between the source voltage VDD and the signal T0, the bias voltage VP provides the bias voltage to the pull-up PMOS transistor 63 (64, 65, 66). The switch 67 is connected between the signal T0 and the ground. The structures of the other three sections are similar to that of the first section, and therefore the description thereof is omitted herein.

Figure 5:
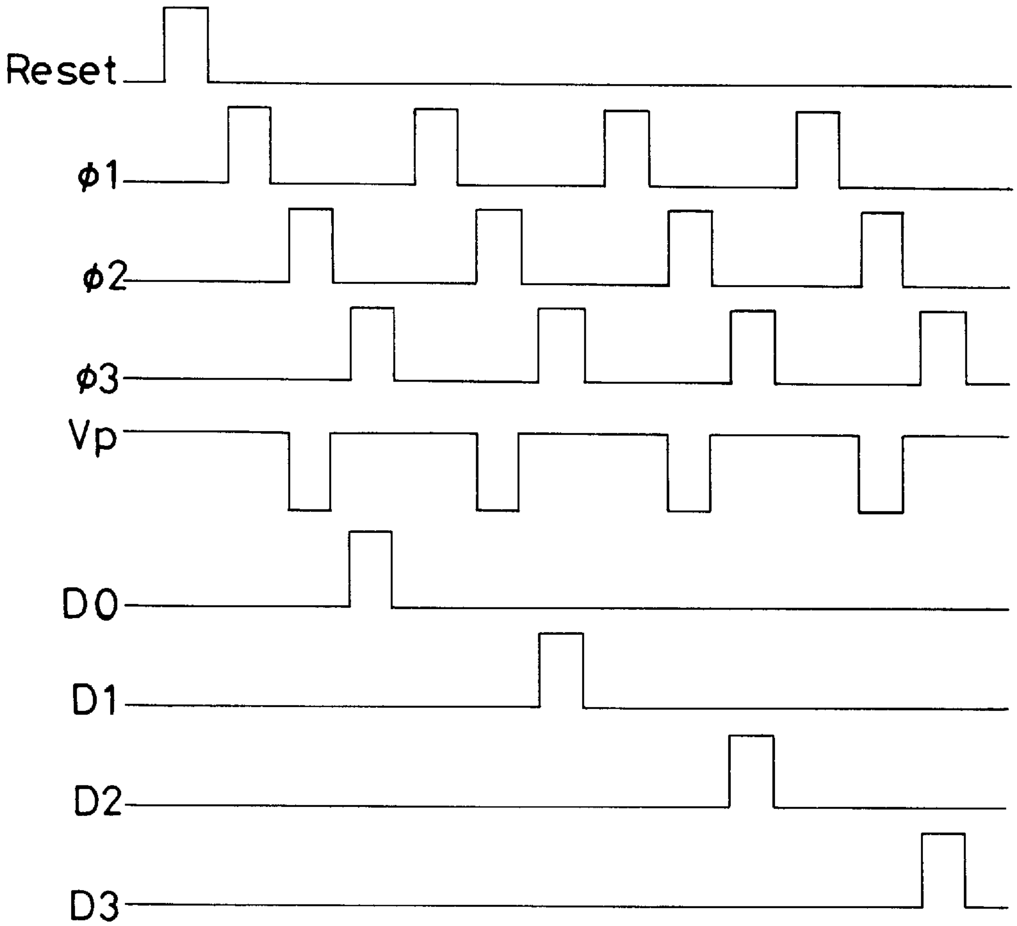
FIG. 5 is a timing charting showing an operation of the switched capacitor sorter based on magnitude in accordance with the present invention.

Referring to FIG. 5, the clock signal *2 is *1 delayed by a pulse, and *3 is *2 delayed by a pulse. Note that an interval between every two pulses for each of the clock signals *1, *2, *3, is longer than two pulses. That is, after a first pulse of *1 appears, a second pulse thereof will not appear before a first pulse of *3 ends. Based on the above description concerning the clock signals, the further detailed operations will be described as follows.

Firstly, the reset signal Reset goes to high to reset each of the input units 10, that is, the voltage at the capacitor 13 is cleared to be zero since the switch 12 is turned on by the signal Reset. In the meantime, the voltage level at a node NCT goes to low, while the level at the node CT goes to high, and Q goes to low. Since the level at the node CT is high, the control signals CP1 and CP2 are completely controlled by the clock signals *1 and *2, respectively.

After the reset operation is finished, the clock signal *1 goes to high, resulting in the switch 11 being turned on, and the input voltage signal Vin charges the capacitor 13 to the level of Vin. When the clock signal *1 goes to high, the four switches 67–70 are turned on accordingly to clear the four nodes T0, T1, T2, and T3.

Returning to FIG. 2, when the *1 goes to low, each of the input voltages Vin is held in the capacitor 13 of the corresponding input unit 10(*k*).

Sequentially, when the clock signal *2 and accordingly the control signal CP2 go to high, the switch 14 is turned on, so that the voltage level held in the capacitor 13 of each of the input units 10(*k*) is passed to the node Tk (k=0, 1, 2, 3) as the signal T. The bias voltage VP supplies the bias voltage to the respective pull-up PMOS transistors 63–66, the WTA circuit 50 starts to work. In the beginning, when the input voltages are fed to the four nodes T0, T1, T2, T3, the levels of the four nodes are all pulled down by the pull-down NMOS transistors 51–62. However, the voltage level of each of the nodes T0, T1, T2, T3 urges the levels of the other three nodes to fall via the pull-down NMOS transistors connected to the other nodes, while the voltage level of its own is pulled up by means of the corresponding pull-up PMOS transistor. Accordingly, an unstable competition among the four nodes T0, T1, T2, T3 occurs. Only the node of which the initial voltage level is the highest can force the voltage levels of the other nodes to be suppressed to the lowest (i.e. zero). As the levels of the other nodes are pulled down, the turned-on degree of each of associated pull-down NMOS transistors for the node with the highest level is getting low, that is, the turn-on resistance increase, so as to promote the level thereof to be pulled up through the associated pull-up PMOS transistor. Finally, the node of which the initial level is the highest is pulled up to a level of VDD, while the other nodes are pulled down to a level of zero. In this manner, the maximum input voltage level is determined. For the convenience of description, herein Vin0 is assumed as the maximum.

It is noted that each the input voltages should be ranged between a threshold voltage of the NMOS transistor and the source voltage VDD.

Since the node TO of the WTA circuit 50 is pulled up to VDD, while the other three nodes T1, T2, T3 are pulled down to 0, the capacitor 13 of the input unit 10(0) is charged to VDD, while the capacitor 13 of each of the other three input units 10(1), 10(2), 10(3) is discharged to 0.

When the clock signal *2 goes to low, the capacitor 13 of the input unit 10(0) is maintained at the level VDD, while the capacitor 13 of each of the other three input units 10(1), 10(2), 10(3) maintains to be 0.

Then, when the clock signal *3 goes to high, the D type flip flop of each of the input units 10 starts to sample. As the *3 goes to high, the switches 22, 29 are turned on, and the switches 25, 26 are turned off. It is clear that the Q0 becomes high since the corresponding capacitor 13 stores a high level voltage, while Q1, Q2, Q3 become low since the voltage level at the capacitor 13 of each of the input units 10(1), 10(2), 10(3) is zero.

Then the clock signal *3 goes to low. In the input unit 10(0), the level of the node NCT becomes high, and Q0 becomes low, so that a pulse is output from Q0. At the other hand, Q1, Q2, and O3 are still low.

Figure 4:
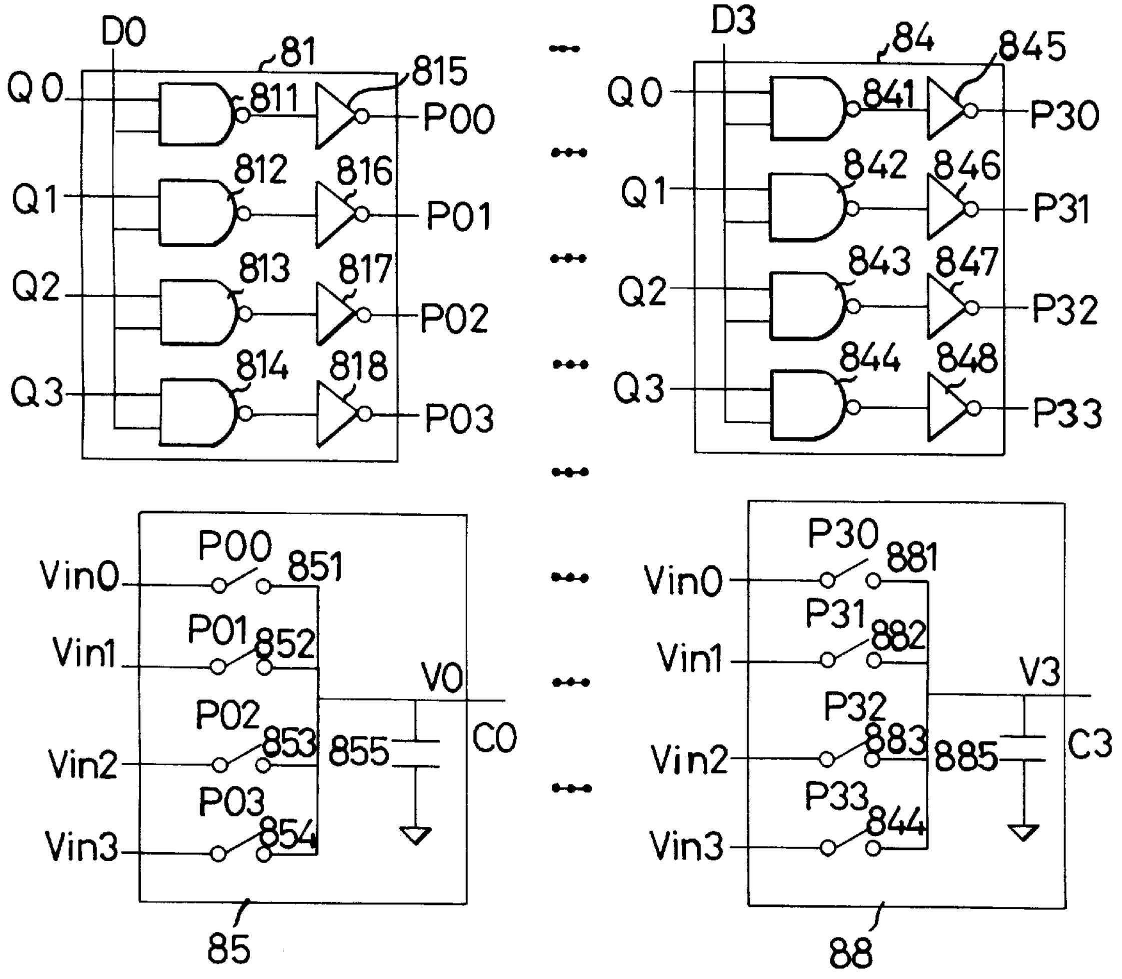
FIG. 4 is a circuit diagram of an output unit of the switched capacitor sorter based on magnitude in accordance with the present invention.

Referring to FIG. 4, the output unit 80 comprises four control sections 81–84 respectively for the four input voltages Vin0, Vin1, Vin2, and Vin3. Control signals Dk (k=0, 1, 2, 3), are fed to the four control sections 81–84, respectively. Each of the control sections 81–84 is composed of basic logic gates, only the control section 81 will be described to avoid repetition. The structures of the other three control sections 82–84 are similar. The control section 81 comprises four NAND gates 811–814 and four inverters 815–818 connected to outputs of the NAND gates 811–814, respectively. Q0, Q1, Q2, and Q3 are input to the NAND gates 811–814, respectively, and the control signal D0 is input to the four NAND gates 811–814. Output terminals P0*k* (k=0, 1, 2, 3) of the inverters 815–818 are the outputs of the control section 81.

The output unit 80 further comprises four output sections 85–88. Only the output section 85 is further described, as the other three output sections 86–88 are similar to it. The output section 85 comprises four switches 851–854 connected in common at one end, and a capacitor 855 connected to the common connection node of the four switches 851–854. The four switches 851–854 are controlled by the signals from the output terminals P00, P01, P02, and P03, respectively. The input voltages Vin0, Vin1, Vin2, and Vin3 are connected to the other ends of the four switches 851–854, respectively.

Also referring to FIG. 5, when the clock signal *3 is high, the control signal DO is also high, resulting in the output P00 of the control section 81 becomes high. Accordingly, the switch 851, which is controlled by the signal from P00, is turned on, so that the capacitor 855 samples and holds the input voltage VinO, and outputs it as the output VO.

Returning to FIG. 2, in the input unit 10(0), the NCT is high and CT is low, resulting the signals CP1 and CP2 are low and no longer controlled by the clock signals *1 and *2. Accordingly, the switches 11 and 14 are turned off so as to isolate the capacitor 13 from Vin0 and T0 until the next reset signal is activated. That is, the capacitor 13 of the input unit 10(0) is maintained at high level regardless of the operation of the WTA circuit 50 until the next reset signal comes. The signal T0 is also maintained at zero during this period of time. Accordingly, in the WTA circuit 50 (FIG. 3), T0 will not influence the sequential comparing operations. In this manner, T1, T2, and T3 are compared and a maximum one among them will be determined by the process described above. The remaining operations can be deduced accordingly. Then, the sorted results can be obtained.

The sorter in accordance with the present invention can output the input voltages in a sorted order on the basis of the magnitudes of the input voltages. In addition, since the Qk (k=0, 1, 2, 3) of the input units 10(*k*) respectively output a pulse according to the order of the magnitudes of the input voltage, the order of the corresponding input voltages can be identified. That is, the sorted results can be obtained and, a sorted order of the input voltages are sorted can also be obtained. In addition, the speed of the sorter is very fast.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A sorter based on magnitude comprising:

a plurality of input units, each of which receiving an input voltage for generating a representing signal and a first control signal;

a winner-take-all (WTA) circuit receiving a clock signal and the representing signal from each of the input units, for determining which one of said representing signals is the maximum one, and pulling up the determined representing signal to a high level while pulling down the other representing signals to a low level during one operation cycle controlled by the clock signal, said determined representing signal being pulled up to high resulting in said first control signal of the corresponding input unit to be active, while the other representing signals being pulled down to low resulting in the first control signals of the corresponding input units to be inactive, and the determined representing signal being eliminated from the determining operations in sequential operation cycles of the WTA circuit; and an output unit receiving the input voltages and said first control signals for outputting one of the input voltage when the first control signal of the corresponding input unit also receiving the same one of the input voltages is active.

2. The voltage sorter as claimed in claim 1, wherein each of said input units comprises a switched capacitor for sampling and holding the corresponding input voltage and a D type flip flop connected to the switched capacitor for detecting the input voltage and generating the representing signal and the first control signal.

3. The voltage sorter as claimed in claim 2, wherein the D type flip flop comprises logic gates and switches.

4. The voltage sorter as claimed in claim 1, wherein said WTA circuit comprises a plurality of sections, the number of the sections being the same as the number of the input units, each of the sections being connected to the representing signal of one of the input units, each section comprising a switch controlled by said clock signal to clear the corresponding one of the sections when it is turned on, a plurality of pull-down transistors, which are commonly connected to the corresponding representing signal at drain terminals, respectively connected to the rest of the representing signals at gate terminals and commonly connected to ground at source terminals, and a pull-up transistor connected between a source voltage and the corresponding representing signal.

5. The voltage sorter as claimed in claim 4, wherein each of said pull-down transistors is an NMOS transistor.

6. The voltage sorter as claimed in claim 4, wherein each of said pull-up transistors is a PMOS transistor.

7. The voltage sorter as claimed in claim 1, wherein said output unit comprises a plurality of control sections each receiving the first control signals from the input units for generating a set of second control signals, and a plurality of output sections each receiving the input voltages and controlled by said set of second control signals for outputting one of the input voltages per time according to the set of second control signals.

8. The voltage sorter as claimed in claim 7, wherein each of said control sections comprises a plurality of NAND gates and a plurality of inverters connected to outputs of the NAND gates, respectively.

9. The voltage sorter as claimed in claim 7, wherein each of said output sections comprises a plurality of switches each being controlled by one of said set of second control signals, and a capacitor, said switches being connected to a corresponding one of the input voltages at one end, and connected together to said capacitor at the other end.

10. A sorter based on magnitude comprising:

a plurality of input units each comprising a switched capacitor and a D type flip flop, said switched capacitor receving an input voltage for sampling and holding the input voltage, said D type flip flop connected to the switched capacitor for detecting the input voltage and generating a representing signal and a first control signal;

a winner-take-all (WTA) circuit comprising a plurality of sections, the number of the sections being the same as the number of the input units, each of the sections being connected to the representing signal of one of the input units, each section comprising a plurality of pull-down transistors, which are commonly connected to the corresponding representing signal at drain terminals, respectively connected to the rest of the representing signals at gate terminals and commonly connected to ground at source terminals, and a pull-up transistor connected between a source voltage and the corresponding representing signal, for pulling up a maximum one of the representing signals to a high level while pulling down the other representing signals to a low level during one operation cycle, said representing signal being pulled up to high resulting in said first control signal of the corresponding input unit to be active, while the other representing signals being pulled down to low resulting in the first control signals of the corresponding input units to be inactive, and the representing signal pulled up to high being eliminated from the determining operations in sequential operation cycles of the WTA circuit; and an output unit comprising a plurality of control sections each receiving the first control signals from the input units for generating a set of second control signals, and a plurality of output sections each receiving the input voltages and controlled by said set of second control signals for outputting one of the input voltages per time according to the set of second control signals.

11. The voltage sorter as claimed in claim 10, wherein each of said pull-down transistors is an NMOS transistor.

12. The voltage sorter as claimed in claim 10, wherein each of said pull-up transistors is a PMOS transistor.

13. The voltage sorter as claimed in claim 10, wherein each of said control sections comprises a plurality of NAND gates and a plurality of inverters connected to outputs of the NAND gates, respectively.

14. The voltage sorter as claimed in claim 10, wherein each of said output sections comprises a plurality of switches each being controlled by one of said set of second control signals, and a capacitor, said switches being connected to a corresponding one of the input voltages at one end, and connected together to said capacitor at the other end.

* * * * *